United States Patent [19]

Pawlowski et al.

[11] Patent Number: 5,364,734
[45] Date of Patent: Nov. 15, 1994

[54] POSITIVE-WORKING RADIATION-SENSITIVE MIXTURE AND RADIATION-SENSITIVE RECORDING MATERIAL PRODUCED THEREWITH

[75] Inventors: Georg Pawlowski, Wiesbaden; Horst Roeschert, Ober-Hilbersheim; Walter Spiess, Dieburg; Klaus-Juergen Przybilla, Frankfurt am Main, all of Germany

[73] Assignee: Hoechst Aktiengesellschaft, Frankfurt am Main, Germany

[21] Appl. No.: 895,649

[22] Filed: Jun. 9, 1992

[30] Foreign Application Priority Data

Jun. 19, 1991 [DE] Germany .............. 4120173

[51] Int. Cl.$^5$ .................. G03C 1/52; G03C 3/00
[52] U.S. Cl. ...................... 430/230; 430/191
[58] Field of Search ........................ 430/191, 230

[56] References Cited

U.S. PATENT DOCUMENTS

| | | | |
|---|---|---|---|
| 3,779,778 | 12/1973 | Smith et al. | 96/115 R |
| 4,189,323 | 2/1980 | Buhr | 430/281 |
| 4,458,000 | 7/1984 | Stahlhofen | 430/270 |
| 4,691,998 | 10/1986 | Buhr | 544/193.1 |
| 4,840,867 | 6/1989 | Elsaesser et al. | 430/156 |

FOREIGN PATENT DOCUMENTS

| | | |
|---|---|---|
| 3601264 | 7/1986 | Germany . |
| 3930086 | 3/1991 | Germany . |
| 3930087 | 3/1991 | Germany . |

OTHER PUBLICATIONS (English Translation) JP 62-175735 "Photo-Sensitive Composite" Akira Nagashima.

Nagashima, "Photosensitive Resin Compositions Containing Radical Generators" Aug. (1987), Abstract CA108(18): 159041j.

F. M. Houlihan, et al., "An Evaluation of Nitrobenzyl Ester Chemistry for Chemical Amplification Resists", SPIE vol. 920, 1988, pp. 67-73.

J. V. Crivello, "Possibilities for Photoimaging Using Onium Salts", Polymer Engineering and Science, vol. 23, No. 17, Dec. 1983, pp. 953-956.

C. G. Willson, "Organic Resist Materials–Theory and Chemistry", Introduction to Microlithography ACS Symp. Ser. 219, 1983, pp. 88-159.

Primary Examiner—John Kight, III
Assistant Examiner—T. Mosley
Attorney, Agent, or Firm—Foley & Lardner

[57] ABSTRACT

A positive-working radiation-sensitive mixture is disclosed that contains (a) a compound that forms strong acid on exposure to actinic radiation that is an ester of a sulfonic acid or sulfonic acids of the formula $R-SO_3H$ or $R'(-SO_3H)_2$ with 2,4-bistrichloromethyl-6-(mono- or dihydroxyphenyl)-1,3,5-triazine of the formulae I and/or II:

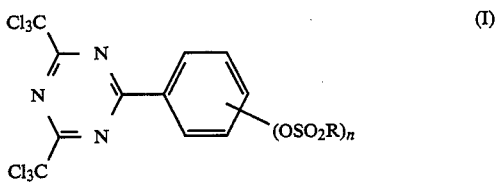

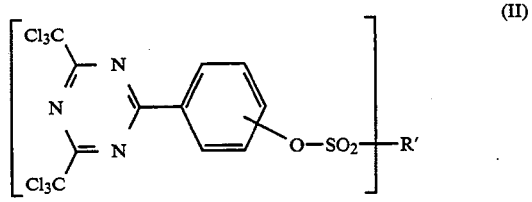

where R is an optionally further substituted $(C_1-C_{10})$ alkyl, $(C_5-C_{10})$cycloalkyl, $(C_6-C_{10})$aryl, $(C_6-C_{10})$aryl-$(C_1-C_{10})$ alkyl or $(C_3-C_9)$heteroaryl radical, R' is an optionally substituted $(C_1-C_{10})$alkylene, $(C_6-C_{10})$arylene or $(C_3-C_9)$heteroarylene radical, and n is 1 or 2, (b) a compound that contains at least one acid-cleavable C—O—C or C—O—Si bond, and (c) a water-insoluble polymeric binder that is soluble or at least swellable in aqueous alkaline solutions.

The radiation-sensitive mixture is remarkable for its high resolution and high sensitivity over a wide spectral range. A radiation-sensitive recording material suitable for producing photoresists, electronic components or printing plates, or for chemical milling is also disclosed.

21 Claims, No Drawings

POSITIVE-WORKING RADIATION-SENSITIVE MIXTURE AND RADIATION-SENSITIVE RECORDING MATERIAL PRODUCED THEREWITH

BACKGROUND OF THE INVENTION

The present invention relates to a positive-working radiation-sensitive mixture containing
(a) a compound that forms strong acid on exposure to actinic radiation,
(b) a compound that contains at least one acid-cleavable C—O—C or C—O—Si bond, and
(c) a water-insoluble polymeric binder that is soluble or at least swellable in aqueous-alkaline solutions.

The invention also relates to a radiation-sensitive recording material produced therewith that is suitable for producing photoresists, electronic components or printing plates, or for chemical milling.

The constant reduction in size of structures, for example, in chip production, down to the range of less than 1 μm requires modified lithographic techniques. In order to image such fine structures, radiation is used that has a short wavelength, such as high-energy UV light, electron beams and X-rays. The radiation-sensitive mixture must be suited to the short-wave radiation. A summary of the requirements imposed on the radiation-sensitive mixture is provided in the paper by C. G. Willson entitled "Organic Resist Materials—Theory and Chemistry" [*Introduction to Microlithography, Theory, Materials, and Processing,* edited by L. F. Thompson, C. G. Willson, and M. J. Bowden, *ACS Symp. Ser.,* 219:87 (1983), American Chemical Society, Washington]. There is therefore an increased requirement for radiation-sensitive mixtures that can be used in the more recent technologies such as mid- or deep-UV lithography [exposure, for example, using excimer lasers at wavelengths of 305 nm (XeF), 248 nm (KrF), 193 nm (ArF)], and electron-beam lithography or X-ray lithography. Preferably these mixtures are also sensitive over a wide spectral range and can be used in conventional UV lithography.

Mixtures that contain as essential constituents a component that forms a strong acid on exposure to actinic radiation and an acid-cleavable compound, for example, containing C—O—C or C—O—Si bonds, in addition to a water-insoluble binder that is soluble or at least swellable in aqueous alkaline solutions, are disclosed in DE 23 06 248 (=U.S. Pat. No. 3,779,778).

As compounds that form a strong acid on irradiation, use particularly has been made of onium salts such as diazonium, phosphonium, sulfonium or iodonium salts of non-nucleophilic acids, such as $HSbF_6$, $HAsF_6$, or $HPF_6$ [J. V. Crivello, *Polym. Eng. Sci.,* 23:953 (1983)]. In addition, halogen compounds, particularly trichloromethyltriazine derivatives or trichloromethyloxadiazole derivatives, o-(quinone diazide)sulfonyl chlorides, o-(quinone diazide)-4-sulfonic acid esters, organometal-/organohalogen combinations, bis(sulfonyl)diazomethane, sulfonylcarbonyldiazomethane (DE 39 30 087) or nitrobenzyl tosylates [F. M. Houlihan et al., *SPIE Proc., Adv. in Resist Techn. and Proc.* 920:67 (1988)]have been recommended.

These compounds are used in negative- or positive-working radiation-sensitive mixtures. The use of these photolytic acid formers, however, entails certain disadvantages that severely restrict their possible uses in various fields of application. For example, many of the onium salts are toxic. Their solubility in many solvents is inadequate, and for this reason only a few solvents are suitable for producing a coating solution. In addition, impurity atoms, some of which are undesirable and which may result in process interferences, particularly in microlithography, are introduced if onium salts are used. Halogen compounds such as (quinone diazide)sulfonyl chlorides form strong hydrohalic acids, but on certain substrates they have only a limited durability. This has been improved by inserting an interlayer between substrate and radiation-sensitive layer containing compounds of the type (a), but this resulted in an undesirable increase in defects and in a reduced reproducibility (DE 36 21 376 =U.S. Pat. No. 4,840,867).

Although other classes of compounds that generate hydrohalic acid such as bis- (EP 137 452 =U.S. Pat. Nos. 4,619,998/4,696,888) or tristrichloromethyltriazines have a good acid-forming efficiency, they have an often inadequate solubility in common resist solvents. They are frequently sweated out of the photosensitive mixtures under processing conditions applied in practice, with the result that a reproducible production of the resultant layer is no longer possible.

The more recent publications by F. M. Houlihan et al., *SPIE* 920:67 (1988) show that, in addition to the above-mentioned acid formers, nitrobenzyl tosylates that form sulfonic acids with low migration tendency on exposure can also be used in certain positive-working, acid-labile resist formulations. From this it can be deduced that such compounds can also be used for photocurable systems. The sensitivities achieved under these circumstances and the thermal stability of the photoresist prove, however, to be inadequate.

Also known are resist formulations containing (naphthoquinone 2-diazide)-4-sulfonic acid esters, oximesulfonates, 1,2-disulfones, bissulfonyldiazomethane (DE 39 30 086) and sulfonylcarbonyldiazomethane (DE 30 30 087). All of these compounds have unsatisfactory quantum yields on exposure to actinic radiation. The resist formulations absorb radiation of the wavelength 248 nm to an appreciable extent. The sensitivity to radiation of this wavelength is in the range from 50 to 100 $mJ/cm^2$. Practical structures having a size of 0.5 μm and less cannot be imaged with such resists.

Despite the intensive research activity carried out in this field, no radiation-sensitive mixture is known at the present time with which it is possible to produce a positive-working radiation-sensitive recording material that has a high sensitivity in the deep LrV region (200 to 300 nm), that has a high resolution, that even with brief irradiation releases a sufficient amount of an acid that is strong enough to cleave compounds of the type (b), and that is still capable of being developed in aqueous alkali and is fully compatible with standard processing conditions.

SUMMARY OF THE INVENTION

It is therefore an object of the present invention to provide a radiation-sensitive mixture based on acid-forming compounds in combination with acid-cleavable compounds, in which the compounds that photolytically form an acid are as stable as possible on all the known substrates, provide strong acid with high efficiency on irradiation, have a good solubility in the common resist solvents and are not sweated out of the photosensitive layer.

These and other objects of the invention are achieved by a positive-working radiation-sensitive mixture comprising:
(a) a compound that forms strong acid on exposure to actinic radiation,
(b) a compound that contains at least one acid-cleavable C—O—C or C—O—Si bond, and
(c) a water-insoluble polymeric binder that is soluble or at least swellable in aqueous alkaline solutions, wherein the compound (a) comprises at least one ester of a sulfonic acid or sulfonic acids of the formula R—SO₃H or R'(SO₃H)₂ with 2,4-bistrichloromethyl-6-(mono- or dihydroxyphenyl)-1,3,5-triazine as represented by formulae I and II:

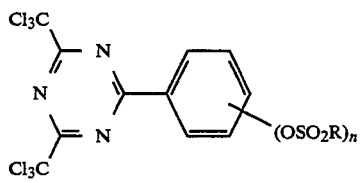

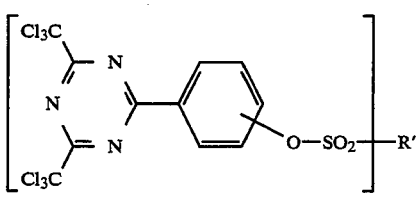

where R is an optionally further substituted ($C_1$–$C_{10}$)alkyl, ($C_5$–$C_{10}$)cycloalkyl, ($C_6$–$C_{10}$)aryl, ($C_6$–$C_{10}$)aryl-($C_1$–$C_{10}$)alkyl, or ($C_3$–$C_9$)heteroaryl radical, R' is an optionally substituted ($C_1$–$C_{10}$)alkylene, ($C_6$–$C_{10}$)arylene or ($C_3$–$C_9$)heteroarylene radical, and n is 1 or 2.

Also provided according to the invention is a positive-working radiation-sensitive recording material comprising a radiation-sensitive layer of this radiation-curable mixture situated on a base.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

A radiation-sensitive mixture according to the present invention comprises
(a) a compound that forms strong acid when exposed to actinic radiation,
(b) a compound that contains at least one acid-cleavable C—O—C or C—O—Si bond, and
(c) a water-insoluble polymeric binder that is soluble or at least swellable in aqueous-alkaline solutions, wherein the compound (a) is an ester of a sulfonic acid or sulfonic acids of the formula R—SO₃H or R'(—SO₃H)₂ with 2,4-bistrichloromethyl-6-(mono- or dihydroxyphenyl)-1,3,5-triazine of the formulae I and/or II:

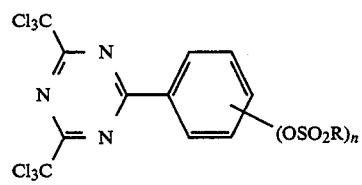

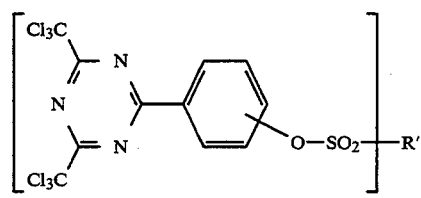

where R is an optionally further substituted ($C_1$–$C_{10}$) alkyl, ($C_5$–$C_{10}$)cycloalkyl, ($C_6$–$C_{10}$)aryl, ($C_6$–$C_{10}$)aryl-($C_1$–$C_{10}$) alkyl or ($C_3$–$C_9$)heteroaryl radical, R' is an optionally substituted ($C_1$–$C_{10}$)alkylene, (C–$C_{10}$)arylene or ($C_3$–$C_9$)heteroarylene radical, and n may be 1 or 2. In the case where n=2 the radicals R may be different. The radicals R and R' may be substituted with at least one substituent selected from the group consisting of ($C_1$–$C_8$)-alkyl, ($C_1$–$C_8$)alkoxy, ($C_1$–$C_8$)alkanoyl, ($C_1$–$C_8$) alkanoyloxy, ($C_6$–$C_{10}$)aryl, cyano and halogen.

As the following examples show, the radicals R and R' may optionally also contain still other substituents, for example, methyl, ethyl, propyl, isopropyl, butyl, hexyl, octyl, decyl, dodecyl, hexadecyl, octadecyl, 10-camphyl, chloromethyl, 2-chloroethyl, 3-chloropropyl, dichloromethyl, trichloromethyl, difluoromethyl, trifluoromethyl, 2,2,2-trifluoroethyl, 1,1,2,3,3,3-hexafluoropropyl, perfluorohexyl, trimethylsilylmethyl, methanesulfonyl-methyl, phenyl, benzyl, 4-acetylphenyl, 4-acetylamino-phenyl, 2-, 3- or 4-bromophenyl, 2-, 3- or 4-chlorophenyl, 2-, 3- or 4-fluorophenyl, 4-iodophenyl, 2-, 3- or 4-methylphenyl, 4-ethylphenyl, 4-propylphenyl, 4-isopropylphenyl, 4-isobutylphenyl, 4-tert-butylphenyl, 4-tert-amylphenyl, 4-hexylphenyl, 4-methoxyphenyl, 4-butoxyphenyl, 4-hexadecyloxyphenyl, 2-, 3- or 4-trifluoromethylphenyl, 2- or 4-trifluoromethoxyphenyl, 2-, 3- or 4-nitrophenyl, 3- or 4-carboxyphenyl, 2-methoxycarbonylphenyl, 4-tetrafluoroethoxyphenyl, β-styryl, 4-acetalamino-3-chlorophenyl, 4-acetalamino-3-fluorophenyl, 3,5-bistrifluoromethylphenyl, 2,5-bis(2,2,2-trifluoroethoxy)phenyl, 2,5-dimethylphenyl, 2,4-, 2,5- or 3,4-dimethoxyphenyl, 2,4-diisopropylphenyl, 5-bromo-2-methoxyphenyl, 2- or 3-chloro-4-fluorophenyl, 3-chloro-2-methylphenyl, 3-chloro-4-methoxyphenyl, 2-chloro-6-methylphenyl, 2-chloro-4-trifluoromethylphenyl, 5-chloro-2-methoxyphenyl, 5-fluoro-2-methylphenyl, 2,5- or 3,4-dibromophenyl, 2,3-, 2,4- or 2,5-, 2,6-, 3,4- or 3,5-dichlorophenyl, 2-(2,4-dichlorophenoxy)phenyl, 4-(2-chloro-6-nitrophenoxy)phenyl, 2,4- or 2,5-difluorophenyl, 3-carboxy-4-chlorophenyl, 4-chloro-3-nitrophenyl, 2-methyl-5-nitrophenyl, 4-chloro-3- or 2-chloro-5-trifluoromethylphenyl, 4-(2,2-dichlorocyclopropylphenyl, 2,4-dinitrophenyl, 4-dimethylamino-3-nitrophenyl, 2-nitro-4-trifluoromethylphenyl, 2,4,6-trimethylphenyl, 2,4,6-triisopropylphenyl, 2,3,4-, 2,4,5- or 2,4,6-trichlorophenyl, 4-chloro-2,5-dimethylphenyl, 2,4-dichloro-5-methylphenyl, 3,5-dichloro-2-hydroxyphenyl, 3-5-dichloro-4-(4-nitrophenoxy)phenyl, 4-(2,-chloro-4- nitrophenoxy)-3,5-dichlorophenyl, 4-bromo-2,5-difluorophenyl, 2,4-dimethyl-3-nitrophenyl, 3,5-dinitro-4-methylphenyl, 2,3,5,6-tetramethylphenyl, 4-methoxy-2,3,6-trimethylphenyl, 2,5-dibromo-3,6-difluorophenyl, 2,3,4,5,6-pentafluorophenyl, 1- or 2-naphthyl, 5-diazo-6-oxo-5,6-dihydro-1-naphthyl, 6-diazo-5-oxo-5,6-dihydro-1-naphthyl, 5-diazo-6-oxo-5,6-dihydro-8-naphthyl, 5-diazo-3-methoxy-6-oxo-5,6-dihydro-8-naphthyl, 5-dimethylamino-1-naphthyl, 1-anthracenyl, 2-anthraquinonyl, 8-quinolinyl, 2-thienyl, 5-chloro-2-thienyl, 4-bromo-2,5-dichloro-3-thienyl, 4,5-dibromo-2-thienyl, 2,3-dichloro-5-thienyl, 2-bromo-3-chloro-5-thienyl, 3-bromo-2-chloro-5-thienyl, 3-bromo-5-chloro-2-thienyl, 2,5-dichloro-3-thienyl, 2-(2-pyridyl)-5-thienyl, 5-chloro-1,3-dimethyl-4-pyrazolyl, 3,5-dimethyl-4-isoxazolyl, 2,4-dimethyl-5-thiazolyl, 2-acetalamino-4-methyl-5-thiazolyl or 1,4-butylene, 2-oxo-1,3-propylene, 1,2- or 1,3-phenylene, 3-methyl-1,2-phenylene, 2,4,6-trimethyl-1,3-phenylene, 4,4'-biphenylene, 4,4'-methylenediphenylene, 4,4'-oxy-biphenylene, 1,5-naphthylene, 2-chloro-3,5-thienylene, 2-(1-methyl-5-trifluoromethyl-3-pyrazolyl)-3,5-thienylene.

There are no restrictions with respect to the position of the hydroxyl group(s) on the aromatic benzene ring, i.e., the corresponding cyanophenol precursors can be freely chosen in relation to the substitution pattern.

Of the compounds of the formula I, those in which n is 1 are preferred. In special radiation-sensitive mixtures, where n=2, incompletely esterified products, i.e., those still containing a free phenolic hydroxy group, may preferably be used to improve the solubility.

The preparation of the esters of sulfonic acids of the formula R—SO$_3$—H or R'(—SO$_3$H)$_2$ with 2,4-bistrichloromethyl-6-(mono- or dihydroxyphenyl)-1,3,5-triazines is known per se. The starting materials used in this process are primarily cyanophenols and the corresponding sulfonyl chlorides. Processes for preparing aromatic sulfonic acid esters are described, for example, by F. Muth in Houben-Weyl-Müller, METHODEN DER ORGANISCHEN CHEMIE (METHODS OF ORGANIC CHEMISTRY), VOl. IX, page 633 (and the literature references cited there), THIEME-VERLAG, 4th edition, Stuttgart 1955, by S. Pawlenko, loc. cit., vol. E 11, page 1084, THIEME-VERLAG, 1st edition, Stuttgart 1985, and in the patent literature using numerous examples. The corresponding sulfonyl anhydrides are also suitable as starting materials (see S. Pawlenko, loc. cit., vol. E 11, page 1086, THIEME-VERLAG, 1st edition, Stuttgart 1985, and P. J. Stang, M. Hanack, L. R. Subramaniam, *Synthesis*, 85 (1982)). This applies in particular to the benzenesulfonyl anhydrides substituted with perfluoroalkyl groups. The preparation of the esters of sulfonic acids of the formula R—SO$_3$H or R'(—SO$_3$H)$_2$ with 2,4-bis-trichloromethyl-6-(mono-or dihydroxyphenyl)-1,3,5-triazines from the esters of the corresponding cyanophenols with sulfonic acids R-SO$_3$H was carried out analogously to the process disclosed in EP 137 452, involving acid-catalyzed condensation with trichloroacetomtile.

The radiation-sensitive mixture according to the invention is remarkable for its high sensitivity over a wide spectral range. During processing under practical conditions, no limitations were observed in relation to the solubility in common resist solvents and in relation to the evaporation of the radiation-sensitive components (a) from the layer. In addition, the radiation-sensitive mixture has a high thermal stability that makes it possible to reproduce in exact detail even the finest structures of an original.

Surprisingly, the quantum yield on irradiating the mixtures according to the invention is higher than on irradiating known mixtures containing 2,4-bistrichloromethyl-1,3,5-triazines. This higher acid-formation efficiency indicates that not only hydrohalic acids, but also, to a lesser extent, sulfonic acids are formed during irradiation, and this contributes to an increased sensitivity in the mixture according to the invention.

The positive-working radiation-sensitive mixtures according to the invention exhibit not only a high thermal resistance and plasma resistance but also outstanding lithographic properties, making resolution possible in the semimicrometer and in some cases even in the subsemimicrometer region. After the imagewise irradiation and subsequent development, a mask image is obtained that is faithful to detail. The resist areas have steep edges. In the irradiated regions, the resist layer is completely stripped, i.e., no remains or residues of the layer are left behind on the substrate. The acids formed during the photolysis result in an efficient cleavage of the resist components (b), and this makes it possible to produce highly sensitive positive-working mixtures.

Recording materials produced with the mixtures according to the invention surprisingly exhibit an image differentiation that satisfies the highest requirements and, still more surprisingly, exhibits improved contrast and resolving power. The mixtures according to the invention make it possible, for example, to produce a highly sensitive positive-working photoresist for high-energy UV2 radiation (for example 248 nm).

Since the mixture according to the invention is sensitive over a wide spectral range, actinic radiation is generally suitable for the imagewise irradiation. In this connection, actinic radiation is to be understood as meaning any radiation whose energy corresponds at least to that of short-wave visible light. In particular, UV radiation in the range from 190 to 450 nm, preferably from 200 to 400 nm, and particularly preferably from 200 to 300 nm, and also electron radiation or X-rays are suitable. In the radiation-sensitive mixture according to the invention the ester of a sulfonic acid or sulfonic acids of the formula R—SO$_3$H or R'(—SO$_3$H)$_2$ with 2,4-bistrichloromethyl-6-(mono- or dihydroxyphenyl)-1,3,5-triazine, the latter forming acid on irradiation, may be used individually or in combination with other acid formers.

In addition, the compounds of the type (a) may also be combined with halogen compounds, in particular with known trichloromethyltriazine derivatives or trichloromethyloxadiazole derivatives, onium salts 1,2-disulfones, o-(quinonediazide)sulfonyl chlorides or organometal/organohalogen combinations. Mixtures with bis(sulfonyl)diazomethanes and sulfonylcarbonyldiazomethanes are also suitable. In such mixtures, however, the disadvantages mentioned at the outset may occur.

The proportion of ester of a sulfonic acid or sulfonic acids of the formula R—SO$_3$H or R'(—SO$_3$H)$_2$ with 2,4-bistrichloromethyl-6-(mono- or dihydroxyphenyl)-1,3,5-triazine in the mixture according to the invention is generally about 0.25 to 15% by weight, preferably about 0.5 to 5% by weight, based on the total weight of solids in the mixture.

In particular, the following classes of compounds have proved satisfactory as acid-cleavable compounds in the radiation-sensitive mixture according to the invention:

(a) those containing at least one orthocarboxylic acid ester and/or carboxylic acid amide acetal group, the compounds also having a polymeric nature and it being possible for the groups mentioned to occur in the main chain or laterally, (b) oligermeric or polymeric compounds containing repeating acetal and/or ketal groups in the main chain, (c) compounds containing at least one enol ether or N-acyliminocarbonate group, (d) cyclic acetals or ketals of β-ketone esters or amides, (e) compounds containing silyl ether groups, (f) compounds containing silyl enol ether groups, (g) monoacetals or monoketals or aldehydes or ketones, respectively, whose solubility in the developer is between 0.1 and 100 g/l, (h) ethers based on tertiary alcohols, (i) carboxylic esters and carbonates whose alcohol component is a tertiary alcohol, an allyl alcohol or a benzyl alcohol, and (j) N,O-acetals, in particular N,O polyacetals.

Acid-cleavable compounds have already been described briefly above. Acid-cleavable compounds of the type (a) are comprehensively described as components of radiation-sensitive mixtures in DE 26 10 842 and 29 28 636. Mixtures containing compounds of the type (b) are disclosed in DE 23 06 248 and 27 18 254. Compounds of the type (c) are described in EP 6 626 and 6 627. Compounds of the type (d) are disclosed in EP 202 196 and compounds of the type (e) in DE 35 44 165 and 36 01 264. Compounds of the type (f) are found in DE 37 30 785 and 37 30 783, while compounds of the type (g) are dealt with in DE 37 30 787. Compounds of the type (h) are described, for example, in U.S. Pat. No. 4,603,101 and compounds of the type (i), for example, in U.S. Pat. No. 4,491,628 and also in J. M. Fréchet et al., J. Imaging Sci. 30:59–64 (1986). Compounds of the type (j) are disclosed in German Patent Application P 41 12 968.7.

Mixtures of the above-mentioned acid-cleavable materials may also be used. However, it is preferable to use an acid-cleavable material that belongs to only one of the above-mentioned types, particularly one containing at least one acid-cleavable C—O—C bond, i.e., particularly preferred are those materials which belong to the types (a), (b), (g), (i) and (j). Of type (b) materials, particular attention should be drawn to the polymeric acetals; of the acid-cleavable materials of the type (g), those derived from aldehydes or ketones having a boiling point of over about 150° C., preferably over about 200° C., are preferred. Particularly preferred are the N,O-polyacetals of the types (j).

The proportion of the compound (b) or the combination of compounds (b) is about 1 to 50% by weight, preferably about 10 to 40% by weight, of the total weight of solids in the radiation-sensitive mixture.

The radiation-sensitive mixture according to the invention also contains at least one polymeric water-insoluble binder (c) that is soluble, or at least swellable, in aqueous alkaline solutions. The binder is particularly distinguished by the fact that it has good compatibility with the other constituents of the radiation-sensitive mixture according to the invention and has a self-absorption that is as low as possible, i.e., a high transparency, particularly in the wavelength range from about 190 to 300 nm. Binders based on novolak condensation resins, that are generally used in combination with naphthoquinone diazides as photoactive components, do not fulfill this condition. Although novolak condensation resins exhibit a reduction in solubility in relation to aqueous alkaline developers in the unexposed regions after imagewise exposure, their self-absorption in the short-wavelength region desired for the irradiation is undesirably high.

Novolak condensation resins may, however, be used in a mixture with other resins that are suitable as binders and that have relatively high transparency. In this connection, the mixing ratios depend predominantly on the nature of the binder to be mixed with the novolak. In particular, its degree of self-absorption in the wavelength range mentioned and also its miscibility with the other constituents of the radiation-sensitive mixture play a decisive role. Generally the binder of the radiation-sensitive mixture according to the invention may contain up to about 30% by weight, in particular up to about 20% by weight, of a novolak condensation resin.

Suitable binders are homopolymers or copolymers of p-hydroxystyrene and its alkyl derivatives, for example, of 3-methyl-4-hydroxystyrene, homopolymers or copolymers of other vinylphenols, for example, of 3-hydroxystyrene, and of the esters or amides of acrylic acid with aromatics containing phenolic groups. The comonomers used may be polymerizable compounds such as styrene, methyl (meth)acrylate or the like.

Mixtures with increased plasma resistance are obtained if silicon-containing vinyl monomers, for example vinyltrimethylsilane, are concomitantly used to prepare the binders. The transparency of such binders is generally higher in the deep UV region, with the result that improved structuring is possible.

Homopolymers or copolymers of maleimide may be used with equal success. These binders also exhibit a high transparency in the deep UV region. Here, again, the comonomers used are preferably styrene, substituted styrenes, vinyl ethers, vinyl esters, vinylsilyl compounds or (meth)acrylates.

Finally, copolymers of styrene with comonomers which increase solubility in aqueous alkaline solutions may also be used. These include, for example, maleic anhydride and half-esters of maleic acid.

The binders mentioned may be mixed with one another., provided the optical quality of the radiation-sensitive mixture is not thereby impaired. Binder mixtures are, however, not preferred.

The amount of the binder is generally about 40 to 95% by weight, particularly about 50 to 90% by weight, based on the total weight of the solid components of the radiation-sensitive mixture.

The absorbance of the binder or the combination of binders for radiation of the wavelength 248 nm is preferably less than about 0.35 $\mu m^{-1}$, particularly preferably less than about 0.25 $\mu m^{-1}$. The glass transition temperature of the binder or of the binder mixture is advantageously at least about 120° C.

Optionally, dyes, pigments, plasticizers, wetting agents and levellers, and also polyglycols, cellulose ethers, for example ethylcellulose, may furthermore be added to the radiation-sensitive mixtures according to the invention to fulfill special requirements, such as flexibility, adhesion and gloss.

If a substrate is to be coated, the radiation-sensitive mixture according to the invention is expediently dissolved in a solvent or in a combination of solvents.

Ultimately, the choice of solvent or solvent mixture depends on the coating process used, the desired layer thickness and the drying conditions. The solvent must also be chemically inert to the other layer constituents under the application conditions. Particularly suitable solvents and coating processes applied are comprehensively described in German Patent Application P 41 12 971.7 and are used here analogously. The solution prepared with the solvents mentioned generally has a solids content of about 5 to 60% by weight, preferably up to about 50% by weight.

Also provided according to the invention is a radiation-sensitive recording material that is essentially composed of a substrate with a layer of a radiation-sensitive mixture according to the invention.

Suitable substrates are all the materials of which capacitors, semiconductors, multilayer printed circuits or integrated circuits are composed or from which they can be prepared. Optionally, an adhesion promoter is used. The substrates, adhesion promoters and base materials disclosed by German Patent Application P 41 12 971.7 for producing photomechanical recording layers are also applied here analogously. The German application also describes suitable radiation sources for imagewise exposure to actinic radiation of a recording material according to the invention.

The thickness of the photosensitive layer depends on the application purpose. Generally it is between about 0.1 and 100 μm, preferably between about 0.5 and 10 μm, and particularly preferably around 1.0 μm.

The present invention also provides a process for producing a radiation-sensitive recording material. German Application P 41 12 971.7 describes application of the radiation-sensitive mixture to the substrate, aqueous solutions suitable as developers, the postcuring of the developed layer structures and the use of the radiation-sensitive mixture according to the invention in the production of integrated circuits or of individual electrical modules using lithographic processes.

The radiation-sensitive mixtures according to the invention have a high photosensitivity, particularly when irradiated with light having a wavelength between about 190 and 300 nm. Since the mixtures bleach out very well on exposure, finer structures can be obtained than is possible with known mixtures. The developed resist layer is used under these circumstances as a mask for the subsequent processing steps. Such steps are, for example, the etching of the layer base, the implantation of ions in the layer base or the deposition of metals or other materials on the layer base.

The examples described below illustrate, but do not restrict, the invention. In the following, pbw stands for parts by weight and pbv for parts by volume. The relationship between pbw and pbv is the same as that between g and cm$^3$.

Preparation Example 1

Stage 1: 4-Cyanophenol (25.0 pbw) and 31.2 pbw of triethylamine are dissolved in 200 pbw of tetrahydrofuran and cooled to 5° C. While stirring and keeping the temperature constant, 39.8 pbw of p-toluenesulfonyl chloride dissolved in 50 pbw of tetrahydrofuran are added dropwise. The mixture is brought to room temperature, stirred for a further 2 hours, then stirred into 1,000 pbv of distilled water. After acidification to a pH of 2 to 3, the precipitate is filtered off by suction, washed with water until neutral and dried. The crystalline material is recrystallized from isopropanol. An amount of 53 pbw of 4-(toluene-4-sulfonyloxy)benzonitrile (white crystals having a melting point of 85° C.) is obtained.

Stage 2: An amount of 13.6 pbw of the compound described above is dissolved in 43.4 pbw of trichloroacetonitrile with moisture excluded and 2.7 pbw of aluminum bromide are added. Dry hydrogen chloride gas is passed into this mixture at 24° to 30° C. until saturation is reached. The solidifying mixture is allowed to stand for 24 hours at room temperature. It is then taken up in 400 pbw of methylene chloride and washed twice, using 100 pbw of water each time. The organic phase is dried, filtered and evaporated. The residue is recrystallized from ethanol. An amount of 23.5 pbw of 2,4-bistrichloromethyl-6-[4-(toluene-4-sulfonyloxy)-phenyl]-1,3,5-triazine (white crystals having a melting point of 156° C.) is obtained.

Preparation Example 2

Stage 1: 4-Cyanophenol (25.0 pbw) and 31.2 pbw of triethylamine are dissolved in 200 pbw of tetrahydrofuran and cooled to 5° C. While stirring and keeping the temperature constant, 23.3 pbw of methanesulfonyl chloride dissolved in 50 pbw of tetrahydrofuran are added dropwise. The mixture is brought to room temperature, stirred for a further 2 hours, then stirred into 1,000 pbv of distilled water. After acidification to a pH of 2 to 3, the precipitate is filtered off by suction, washed with water until neutral and dried. The crystalline material is recrystallized from isopropanol. An amount of 35 pbw of 4-methanesulfonyloxybenzonitrile (white crystals having a melting point of 93° C.) is obtained.

Stage 2: An amount of 9.8 pbw of the compound described above is dissolved in 43.4 pbw of trichloroacetonitrile with moisture excluded and 2.7 pbw of aluminum bromide are added. Dry hydrogen chloride gas is passed into this mixture at 24° to 30° C. until saturation is reached. The solidifying mixture is allowed to stand for 24 hours at room temperature. It is taken up in 400 pbw of methylene chloride and washed twice, using 100 pbw of water each time. The organic phase is dried, filtered and evaporated. The residue is recrystallized from ethanol. An amount of 13.8 pbw of 2,4-bistrichloromethyl-6-(4-methanesulfonyloxyphenyl)-1,3,5-triazine (white crystals having a melting point of 142° C.) is obtained.

Preparation Example 3

Stage 1: 4-Cyanophenol (11.9 pbw) and 15.0 pbw of triethylamine are dissolved in 120 pbw of tetrahydrofuran and cooled to 0° C. While stirring and keeping the temperature constant, 22.6 pbw of naphthalene-2-sulfonyl chloride dissolved in 50 pbw of tetrahydrofuran are added dropwise to this mixture. The mixture is brought to room temperature, stirred for a further 2 hours, then stirred into 1,000 pbv of distilled water. After acidification to a pH of 2 to 3, the precipitate is filtered off by suction, washed with water until neutral and dried. The crystalline material is recrystallized from isopropanol. An amount of 25.3 pbw of 4-(naphthalene-2-sulfonyloxy)benzonitrile (white crystals having a melting point of 112° C.) is obtained.

Stage 2: An amount of 23.2 pbw of the compound described above is dissolved in 65.0 pbw of trichloroacetonitrile with moisture excluded and 4.0 pbw of aluminum bromide are added. Dry hydrogen chloride gas is passed into this mixture at 24° to 30° C. until saturation is reached. The solidifying mixture is allowed to stand for 24 hours at room temperature. It is then taken up in 400 pbw of methylene chloride and washed twice, using 100 pbw of water each time. The organic phase is dried, filtered and evaporated. The residue is recrystallized from ethyl acetate. An amount of 32.5 pbw of 2,4-bistrichloromethyl-6-[4-(naphthalene-2-sulfonyloxy)phenyl]-1,3,5-triazine (white crystals having a melting point of 175° C.) is obtained.

Preparation Example 4

Stage 1: 4-Cyanophenol (6.0 pbw) and 7.5 pbw of triethylamine are dissolved in 200 pbw of tetrahydrofuran and cooled to 5° C. While stirring and keeping the temperature constant, 10.3 pbw of 4-methoxybenzenesulfonyl chloride dissolved in 50 pbw of tetrahydrofuran are added dropwise to this mixture. The mixture is brought to room temperature, stirred for a further 2 hours, then stirred into 1,000 pbv of distilled water. After acidification to a pH of 2 to 3, the precipitate is filtered off by suction, washed with water until neutral and dried. The crystalline material is recrystallized from isopropanol. An amount of 13 pbw of 4-(4-methoxybenzenesulfonyloxy)benzonitrile (white crystals having a melting point of 128° C.) is obtained.

Stage 2: An amount of 11.6 pbw of the compound described above is dissolved in 35.0 pbw of trichloroacetonitrile with moisture excluded and 2.5 pbw of aluminum bromide are added. Dry hydrogen chloride gas is passed into this mixture at 24° to 30° C. until saturation is reached. The solidifying mixture is allowed to stand for 24 hours at room temperature. It is taken up in 300 pbw of methylene chloride and washed twice, using 100 pbw of water each time. The organic phase is dried, filtered and evaporated. The residue is recrystallized from ethyl acetate. An amount of 16.8 pbw of 2,4-bistrichloromethyl-6-[4-(4-methoxybenzenesulfonyloxy)-phenyl]- 1,3,5-triazine(white crystals having a melting point of 168° C.) is obtained.

Preparation Example 5

Stage 1: 3-Cyanophenol (4.0 pbw) and 5.1 pbw of triethylamine are dissolved in 100 pbw of tetrahydrofuran and cooled to 5° C. While stirring and keeping the temperature constant, 10.0 pbw of 2,4,6-triisopropylbenzenesulfonyl chloride dissolved in 50 pbw of tetrahydrofuran are added dropwise to this mixture. The mixture is brought to room temperature, stirred for a further 2 hours, then stirred into 1,000 pbv of distilled water. After acidification to a pH of 2 to 3, the precipitate is filtered off by suction, washed with water until neutral and dried. The crystalline material is recrystallized from isopropanol. An amount of 12 pbw of 3-(2,4,6-triisopropylbenzenesulfonyloxy)benzonitrile (white crystals having a melting point of 70° C.) is obtained.

Stage 2: An amount of 11.5 pbw of the compound described above is dissolved in 26.0 pbw of trichloroacetonitrile with moisture excluded and 2.0 pbw of aluminum bromide are added. Dry hydrogen chloride gas is passed into this mixture at 24° to 30° C. until saturation is reached. The solidifying mixture is allowed to stand for 24 hours at room temperature. It is taken up in 200 pbw of methylene chloride and washed twice, using 100 pbw of water each time. The organic phase is dried, filtered and evaporated. The residue is recrystallized from ethyl acetate. An amount of 10.5 pbw of 2,4-bistrichloromethyl-6-[3-(2,4,6-triisopropylbenzenesulfonyloxy)phenyl]-1,3,5-triazine (white crystals having a melting point of 156° C.) is obtained.

Preparation Example 6

Stage 1: 2-Cyanophenol (11.9 pbw) and 15.2 pbw of triethylamine are dissolved in 100 pbw of tetrahydrofuran and cooled to 5° C. While stirring and keeping the temperature constant, 11.4 pbw of methanesulfonyl chloride dissolved in 50 pbw of tetrahydrofuran are added dropwise to this mixture. The mixture is brought to room temperature, stirred for a further 2 hours, then stirred into 1,000 pbv of distilled water. After acidification to a pH of 2 to 3, the precipitate is filtered off by suction, washed with water until neutral and dried. The crystalline material is recrystallized from isopropanol. An amount of 13.5 pbw of 2-methanesulfonyloxybenzonitrile (white crystals having a melting point of 58° C.) is obtained.

Stage 2: An amount of 2.8 pbw of the compound described above is dissolved in 56.6 pbw of trichloroacetonitrile with moisture excluded and 2.0 pbw of aluminum bromide are added. Dry hydrogen chloride gas is passed into this mixture at 24° to 30° C. until saturation is reached. The solidifying mixture is allowed to stand for 24 hours at room temperature. It is taken up in 200 pbw of methylene chloride and washed twice, using 100 pbw of water each time. The organic phase is dried, filtered. and evaporated down. The residue is recrystallized from isopropanol. An amount of 15.7 pbw of 2,4-bistrichloromethyl-6-(2-methanesulfonyloxyphenyl)-1,3,5-triazine (white crystals having a melting point of 86° C.) is obtained.

Preparation Examples 7 to 13

Further compounds of the formula I are disclosed which were prepared analogously to the examples described hitherto. Selected representatives are characterized in the table below in relation to the possible variations described in the formula I. As an analytical value, the quantitative determination of the sulfur and the chlorine content is sufficiently informative.

TABLE

| No. | Position*[)] | R | M.p. [°C.] | % Cl calc. | % Cl found | % S calc. | % S found |
|---|---|---|---|---|---|---|---|
| 7 | para | —$C_6H_5$ | 140 | 38.8 | 38.2 | 5.8 | 5.3 |
| 8 | para | -2,4,5-$(Cl)_3$—$C_6H_2$ | 190 | 49.0 | 49.0 | 4.9 | 5.2 |
| 9 | para | 4-Cl—$C_6H_4$ | 150 | 42.6 | 43.1 | 5.5 | 5.4 |
| 10 | para | 4-Br—$C_6H_4$ | 148 | 33.9 | 34.2 | 5.1 | 5.2 |
| 11 | meta | 4-$CH_3$—$C_6H_4$ | 162 | 37.8 | 38.1 | 5.7 | 6.0 |
| 12 | meta | —$CH_3$ | 120 | 43.8 | 48.5 | 6.6 | 5.9 |
| 13 | ortho | 4-$CH_3C_6H_4$ | 86 | 37.8 | 39.4 | 5.7 | 6.1 |

*[)]Based on the position of the 2,4-bistrichloromethane-1,3,5-triazin-6-yl group on the benzene ring.

Others of the esters described above of sulfonic acids of the formula R—$SO_3H$ or R'(—$SO_3H)_2$ with 2,4-bistrichloromethyl-6-(mono- or dihydroxyphenyl)-1,3,5-triazines can also be prepared analogously.

The esters of sulfonic acid or sulfonic acids of the formula R—$SO_3H$ or R'(—$SO_3H)_2$ with 2,4-bistrichloromethyl-6-(mono- or dihydroxyphenyl)-1,3,5-triazines were characterized by $^1$H high-field nuclear resonance spectra, by elemental analyses and by IR spectroscopy to demonstrate the absence of free hydroxyl groups in the product.

Application Examples 1 to 5

These examples confirm the suitability of the mixture according to the invention for recording materials in microlithography. The superiority of the mixtures according to the invention compared with the prior art is demonstrated on the basis of Comparison Examples 6 and 7.

EXAMPLE 1

A coating solution was prepared from 4.5 pbw of a homopolymer of 3-methyl-4-hydroxystyrene having a softening range around 150° C. and an average molecular weight of around 28,000 [determined by gel permeation chromatography (GPC)], 3.0 pbw of an N,O-polyacetal prepared from benzaldehyde dimethyl acetal and a urethane alcohol (prepared from ethylene carbonate and N-propylamine) in accordance with Preparation Example 1 of German Patent Application P 41 12 968.7, and 0.15 pbw of 2,4-bistrichloromethyl-6-[4-(toluene-4-sulfonyloxy)phenyl]-1,3,5-triazine in accordance with Preparation Example 1, in 42 pbw of propylene glycol monomethyl ether acetate.

The coating solution was filtered through a filter having a pore diameter of 0.2 μm and spun onto a wafer pretreated with an adhesion promoter (hexamethyldisilazane). In this process, the spinning speed was chosen in such a way that layer thicknesses of around 1.07 μm were obtained after drying for 1 minute at 130° C. on a hotplate.

The recording material was exposed imagewise under an original using the radiation of a KrF excimer laser (248 nm) having an energy of 3.8 mJ/cm$^2$ and then subjected to a post-exposure bake on a hotplate at 50° C. for 1 minute.

The recording material was developed with a 0.27 N aqueous tetramethylammonium hydroxide solution.

After a development time of 30 seconds, a faultfree image of the mask having steep resist edges was obtained, even 0.35 μm structures resolved in a true-to-detail manner. An examination of the edges of the resist profiles by scanning electron microscopy confirmed that the latter were arranged virtually perpendicularly to the substrate surface.

The radiation-sensitive recording materials described in Examples 2 to 5 also yielded a perfect image of the mask with steep resist edges, even less than 0.40 μm structures resolved in a true-to-detail manner. The resist edges were aligned in all cases virtually perpendicularly to the substrate surface.

EXAMPLE 2

A coating solution was prepared from 4.5 pbw of a copolymer of styrene/p-hydroxystyrene (molar ratio 75:25) having an average molecular weight of 30,000 (GPC), 3.0 pbw of an O,O-acetal prepared from terephthaldialdehyde tetramethyl acetal and 2-phenoxyethanol prepared analogously to Preparation Example 1 in DE 37 30 787, and 0.1 pbw of 2,4-bistrichloromethyl-6-(4-benzenesulfonyloxyphenyl)-1,3,5-triazine in accordance with Preparation Example 7, in 42 pbw of propylene glycol monomethyl ether acetate.

Coating, drying and development conditions corresponded to Example 1 (post-exposure bake: 75° C./45 s).

The recording material was imagewise exposed under an original with the UV radiation from a xenon/mercury vapor lamp at 260 nm (using an interference filter) having an energy of 4.6 mJ/cm$^2$ and developed for 50 seconds.

EXAMPLE 3

A wafer was prepared using a coating solution as in Example 1, with the sole deviation that, instead of the 0.15 pbw of 2,4-bistrichloromethyl-6-(4-toluene-4-sulfonyloxy)phenyl-1,3,5-triazine used there, 0.075 pbw of 2,4-bistrichloromethyl-6-[4-(4-methoxybenzenesulfonyloxy)phenyl]-1,3,5-triazine prepared in accordance with Preparation Example 4 was used. The wafer was then imagewise exposed with an energy of 5.7 mJ/cm$^2$ (KrF excimer laser). After a post-exposure bake (60° C./1 min), development was carried out as described in Example 1, in which process the exposed regions were stripped without residue within 40 seconds.

EXAMPLE 4

A coating solution was prepared from 7.0 pbw of a copolymer of 3-methyl-4-hydroxystyrene/4-hydroxystyrene (molar ratio 72:28) having a softening range of around 155° C. and an average molecular weight of 26,0000 (GPC), 3.0 pbw of an N,O-polyacetal prepared from 3,4-methylenedioxybenzaldehyde dimethyl acetal and a urethane alcohol (prepared from ethylene oxide and n-hexylamine) prepared in accordance with Preparation Example 2 of German Patent Application P 41 12 968.7, and 0.25 pbw of 2,4-bistrichloromethyl-6-(4-methane-sulfonyloxyphenyl)-1,3,5-triazine prepared in accordance with Preparation Example 2, in 42 pbw of propylene glycol monomethyl ether acetate.

The solution was pretreated as in Example 1, spun on and dried (120° C./1 min), and the recording material was exposed imagewise with an energy of 3.4 mJ/cm$^2$ (Xenon/mercury vapor lamp). After the post-exposure bake (60° C./1 min), development was carried out as in Example 1, in which process the exposed regions were stripped without residue within 50 seconds.

EXAMPLE 50

As described in Example 1, a wafer was prepared using a coating solution as in Example 4, with the sole deviation that, instead of the 3.0 pbw of an N,O-polyacetal used there, 2,0 pbw of an O,O-acetal prepared from benzaldehyde dimethyl acetal and 3-phenylpropanol by analogy with Preparation Example 1 in DE 37 30 787 were used. The wafer was then imagewise exposed with an energy of 4.3 mJ/cm$^2$ (Xenon/mercury vapor lamp). After a post-exposure bake (70° C./1 min), development was carried out as described in Example 1, in which process the exposed regions were stripped without residue within 70 seconds.

EXAMPLES 6 AND 7 (Comparison Examples)

The resist formulation of Example 4 was modified so that the acid-forming compound used there was replaced by the same amount of 2,4-bistrichloromethyl-6-(4-methoxy-1-naphthyl)-1,3,5-triazine (photoinitiator No. 3 in Table 2 of DE 27 18 259) or 4,6,4′,6′-tetrabistrichloro-methyl-2,2′-p-phenylenebis-1,3,5-triazine prepared in accordance with the process specified in the German reference.

The attempt to prepare a coating solution corresponding to the composition specified in Example 6 was unsuccessful since the acid-forming compound does not have an adequate solubility in the resist solvent in the concentration specified in Example 6. Only a markedly reduced concentration of the photoactive acid former results in a homogeneous coating solution. These resist formulations exhibited, however, a substantially reduced sensitivity (>10 mJ/cm$^2$) compared with the mixture according to the invention.

Various experiments on irradiating a coated wafer (coated with a coating solution according to Example 7) revealed marked differences in the photosensitivities. These variations in sensitivity varied in the order of magnitude of ±5% to ±10%. Analytical examinations of the coating solution using HPLC (high-pressure liquid chromatography) before and after the drying process (soft bake) (without subsequent exposure step) revealed that appreciable quantities of the acid-forming compound evaporated from the layer. This behavior makes the control of the photosensitivity necessary for a practical processing virtually impossible. In comparable investigations of the radiation-sensitive mixtures according to the invention, such a behavior was not observed in any case.

What is claimed is:

1. A positive-working radiation-sensitive mixture comprising:
   (a) a compound that forms strong acid on exposure to actinic radiation,
   (b) a compound that contains at least one acid cleavable C—O—C or C—O—Si bond, and
   (c) a water-insoluble polymeric binder that is soluble or at least swellable in aqueous alkaline solutions,
wherein the compound (a) comprises at least one ester of a sulfonic acid or sulfonic acids of the formula R—SO$_3$H or R′(SO$_3$H)$_2$ with 2,4-bistrichloromethyl-6-(mono- or dihydroxyphenyl)-1,3,5-triazine as represented by formulae I and II:

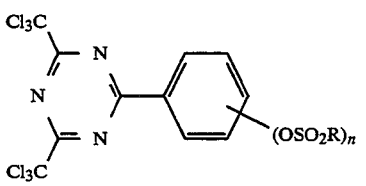

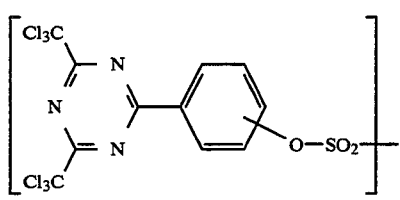

where R is an optionally further substituted (C$_1$-C$_{10}$)alkyl, (C$_5$-C$_{10}$)cycloalkyl, (C$_6$-C$_{10}$)aryl, (C$_6$-C$_{10}$)aryl-(C$_1$-C$_{10}$)alkyl or (C$_3$-C$_9$)heteroaryl radical, R′ is an optionally substituted (C$_1$-C$_{10}$)alkylene, (C$_6$-C$_{10}$)arylene or (C$_3$-C$_9$)heteroarylene radical, and n is 1 or 2, and wherein if R or R′ is further substituted it is substituted with a substituent selected from the group consisting of (C$_1$-C$_8$)alkyl, (C$_1$-C$_8$) alkoxy, (C$_1$-C$_8$)alkanoyl, (C$_1$-C$_8$)alkanoyloxy, (C$_6$-C$_{10}$)aryl, cyano, and halogen.

2. A positive-working radiation-sensitive mixture as claimed in claim 1, wherein the 2,4-bistrichloromethyl-6-(dihydroxyphenyl)-1,3,5-triazines are completely esterified with sulfonic acids R—SO$_3$H.

3. A positive-working radiation-sensitive mixture as claimed in claim 1, wherein the radical R or R′ is substituted with at least one substituent selected from the group consisting of (C$_1$-C$_8$) alkyl, (C$_1$-C$_8$)alkoxy, (C$_1$-C$_8$)alkanoyl, (C$_1$-C$_8$)alkanoyloxy, (C$_6$-C$_{10}$)aryl, cyano and halogen.

4. A positive-working radiation-sensitive mixture as claimed in claim 1, wherein the proportion of the compound (a) is about 0.25 to 15% by weight, based on the total weight of solids in the mixture.

5. A positive-working radiation-sensitive mixture as claimed in claim 1, wherein the proportion of the compound (b) containing at least one acid-cleavable C—O—C or C—O—Si bond is about 1 to 50% by weight, based on the total weight of solids in the mixture.

6. A positive-working radiation-sensitive mixture as claimed in claim 1, wherein the binder (c) has an absorbance of less than about 0.35 $\mu$m$^{-1}$ for radiation of the wavelength 248 nm.

7. A positive-working radiation-sensitive mixture as claimed in claim 1, wherein the proportion of the binder (c) is from about 40 to 95% by weight, based on the total weight of solids in the mixture.

8. A positive-working radiation-sensitive mixture as claimed in claim 1, wherein the proportion of the compound (a) is about 0.5 to 5% by weight, based on the total weight of solids in the mixture.

9. A positive-working radiation-sensitive mixture as claimed in claim 1, wherein the proportion of the compound (b) containing at least one acid-cleavable C—O—C or C—O—Si bond is about 10 to 40% by weight, based on the total weight of solids in the mixture.

10. A positive-working radiation-sensitive mixture as claimed in claim 1, wherein the binder (c) has an absorbance of less than about 0.25 $\mu$m$^{-1}$ for radiation of the wavelength 248 nm.

11. A positive-working radiation-sensitive mixture as claimed in claim 1, wherein the proportion of the binder (c) is from about 50 to 90% by weight, based on the total weight of solids in the mixture.

12. A positive-working radiation-sensitive recording material comprising:
    a base; and
    a radiation-sensitive layer of a radiation-curable mixture as claimed in claim 1 situated on the base.

13. A positive-working radiation-sensitive mixture as claimed in claim 1, wherein component (a) comprises an ester of formula (I).

14. A positive-working radiation-sensitive mixture as claimed in claim 1, wherein component (a) comprises an ester of formula (II).

15. A positive-working radiation-sensitive mixture as claimed in claim 13, wherein n is 1.

16. A positive-working radiation-sensitive mixture as claimed in claim 13, wherein n is 2.

17. A positive-working radiation-sensitive mixture as claimed in claim 1, wherein the binder comprises at most 30% by weight of a novolak condensation resin.

18. A positive-working radiation-sensitive mixture as claimed in claim 1, wherein the binder comprises a polymer of p-hydroxystyrene or 3-methyl-4-hydroxystyrene.

19. A positive-working radiation-sensitive mixture as claimed in claim 1, wherein the acid-cleavable compound comprises an N,O-polyacetal, N,O acetal, O,O polyacetal, or O,O acetal.

20. A positive-working radiation-sensitive mixture as claimed in claim 1, further comprising propylene glycol monomethyl ether acetate as solvent.

21. A positive-working radiation-sensitive mixture as claimed in claim 1, wherein R and R' do not contain a naphthoquinonediazide or quinonediazide group.

* * * * *